United States Patent [19]
Ogitani et al.

[11] Patent Number: 5,061,744
[45] Date of Patent: Oct. 29, 1991

[54] RESIST INK COMPOSITION

[75] Inventors: Osamu Ogitani; Takashi Shimizu, both of Koshigaya; Ryuichi Fujii, Urawa; Masao Kawashima, Warabi; Tuyoshi Kobayashi, Himi; Ichiro Akutagawa, Nagareyama, all of Japan

[73] Assignee: Somar Corporation, Japan

[21] Appl. No.: 376,284

[22] Filed: Jul. 5, 1989

[51] Int. Cl.$^5$ ................................................ C08K 5/16
[52] U.S. Cl. .................................... 523/461; 523/216; 524/445; 524/447; 106/468
[58] Field of Search ................ 523/216, 461; 524/445, 524/447; 106/468

[56] References Cited

U.S. PATENT DOCUMENTS 4,190,686 2/1980 Muis ..................................... 524/445

FOREIGN PATENT DOCUMENTS 63-162755 7/1988 Japan .
1-092376 4/1989 Japan .
1-129080 5/1989 Japan ................................... 524/445

Primary Examiner—Paul R. Michl
Assistant Examiner—Yong S. Lee
Attorney, Agent, or Firm—Lorusso & Loud

[57] ABSTRACT

A resist ink composition suitable for forming a masking pattern resistive against chemical attack by a chemical plating liquor is disclosed which comprises:
a phenol novolak epoxy resin having an epoxy equivalent of 170–250;
a phenol novolak resin having a softening point of 60°–130° C.;
a montmorillonite organic complex such as bentonite ion-exchanged with an organic cation;
a curing-accelerating catalyst; and
an organic solvent.

15 Claims, No Drawings

RESIST INK COMPOSITION

BACKGROUND OF THE INVENTION

This invention relates generally to a resist ink to be used in the fabrication of printed circuit boards and, more particularly, to a resist ink composition suitable for forming on a board a printed, masking pattern which is resistive against chemical plating.

One such a resist ink is a two-part ink composed of a first part containing an epoxy resin, a filler, such as silica or aluminum silicate, and an organic solvent and a second part containing a curing agent, a curing-accelerating catalyst and an organic solvent. In use, the two parts are mixed with each other and the mixture is printed on an insulated board by screen printing. The board with the resultant resist masking pattern is then subjected to a chemical plating treatment for the formation of the desired copper wiring pattern on the board.

The known resist ink has the following problems. Firstly, the physical properties such as viscosity and thixotropy of the ink tend to change with time so that it is difficult to obtain stable printed patterns. Secondly, in repeated screen printing with the ink on boards, fine partterns are failed to be reproduced well. That is, with the known ink, it is difficult to form, with satisfactory reproducibility, fine patters with a line width of, for example, about 200 μm. Thirdly, the resistance of the masking pattern against chemical attach by a chemical plating liquor is not fully satisfactory so that it cannot withstand severe conditions required in a high speed plating process. The fourth problem is directed to the deposition of Cu on the resist masking pattern. Growth of such deposits will cause short circuit of the wiring pattern.

SUMMARY OF THE INVENTION

It is, therefore, an object of the present invention to provide a resist ink which the above problems of the conventional resist ink have been overcome.

It is a special object of the present invention to provide a resist ink which has a highly stable thixotropy, which affords masking patterns with fine lines having a width of as thin as 100 μm with excellent reproducibility by screen printing, which gives resist masking patterns having excellent stability against a strong acid or an alkali, and which is devoid of a problem of Cu deposition.

It is a further object of the present invention to provide a resist ink of the above-mentioned type which can give resist masking patterns which are free of cracks.

It is yet a further object of the present invention to provide a resist ink of the above-mentioned type which is free of foaming and which is suitable for high speed screen printing.

In accomplishing the foregoing objects, there is provided in accordance with the present invention a resist ink composition comprising:
a phenol novolak epoxy resin having an epoxy equivalent of 170–250;
a phenol novolak resin having a softening point of 60°–130° C.;
a montmollilonite organic complex;
a curing-accelerating catalyst; and
an organic solvent.

In another aspect, the present invention provides a two-part ink consisting of:
a first part comprising:
  a phenol novolak epoxy resin having an epoxy equivalent of 170–250,
  a montmorllnite organic complex, and
  an organic solvent; and a second part comprising:
  a phenol novolak resin having a softening point of 60–130,
  a curing-accelerating catalyst, and an organic solvent,
said first and second parts, when mixed with each other, affording a composition serving as a resist ink.

The present inventors have found that depositon of Cu during chemical plating on resist masking patterns obtained with the conventional resist ink is related to the filler employed. That is, the resist ink which contains silica or aluminum as the filler has not sufficiently high resistance to chemicals so that the surface of the resist masking patterns are roughened as the chemical plating proceeds. The roughened surface is susceptible to Cu deposition. It has been found that the surface roughness also results from the lack of compatibility between the filler and the resin. Namely, with the conventional resist ink, there are formed fine interstices in the boundary between the filler and resin, into which the chemical plating liquor penetrates, thereby to roughen the surface of the resist masking patterns.

Other objects, features and advantages of the present invention will become apparent from the detailed description of the invention to follow.

DETAILED DESCRIPTION OF THE INVENTION

The term "phenol novolak epoxy resin" used in the present specification is intended to refer to a substance obtained by reaction of a phenol novolak resin with epichlorohydrin in the presence of an alkaline catalyst. The phenol novolak resin to be used as the raw material is a resin obtained by reaction of a phenol compound such as phenol, cresol or bisphenol A with formaldehyde in the presence of an acid catalyst. The phenol novolak epoxy resin should have an epoxy equivalent of 170–250. Epikote 154 (manufactured by Yuka Shell Epoxy Inc.) is a suitable example of the phenol novolak epoxy resin. The term "epoxy equivalent" used herein is intended to refer to "weight per epoxy" which is a weight (g) of the epoxy resin providing 1 g equivalent of the epoxy group thereof.

A phenol novolak resin is used as a curing agent for the above epoxy resin. The phenol novolak resin is one obtained by reaction of a phenol compound such as phenol, cresol or bisphenol A with formaldehyde in the presence of an acid catalyst. The phenol novolak resin should have a softening point of 60°–130° C. The hydroxyl equivalent of the novolak resin is preferably 100–150. BRC-556 (manufactured by Showa Kobunshi K.K.) is a suitable example of the phenol novolak resin. The term "hydroxyl equivalent" used herein is intended to refer to "weight per hydroxyl group" which is a weight (g) of the novolak resin providing 1 g equivalent of the hydroxyl group thereof.

It is preferred that the phenol novolak resin be used in an amount so that the weight ratio of the phenol novolak resin to the phenol novolak epoxy resin is in the range of $0.5E_1/E_2$ to $2E_1/E_2$ where $E_1$ and $E_2$ represent the hydroxyl equivalent of the phenol novolak resin and the epoxy equivalent of the phenol novolak epoxy resin, respectively.

The phenol novolak resin is used in conjunction with a catalyst which serves to accelerate the curing reaction between the phenol novolak epoxy resin and the phenol novolak resin. Any known curing-accelerating catalyst may be used for the purpose of the present invention. Imidazole compounds, such as 2-methylimidazole, 2-phenylimidazole, 2-heptadecylimidazole, 2-undecylimidazole, 2-ethyl-4-methylimidazole, 2,4-dimethylimidazole, 2-isopropylimidazole and 2-phenyl-4-methylimidazole are illustrative of suitable curing-accelerating catalysts. Triphenylphosphine, 1,8-diazabicyclo(5,4,0)undecene-7 and a phenol salt, 2-ethylhexanoic acid salt and carbonate thereof may also be suitably used. The catalyst is generally used in an amount of 0.5–10% by weight, preferably 1–6% by weight based on the total weight of the phenol novolak epoxy resin and the phenol novolak resin.

In the present invention a montmorrilonite organic complex is used as a filler. The term "montmorrilonite organic complex" used in the present specification is intended to refer to a montmorrilonite having its exchangeable cation ion-exchanged with an organic cation. As the organic cation, alkyl ammonium may be preferably used. Preferred alkyl ammonium is a compound expressed by the following general formula:

$$(R^1)_n N (R^2)_m$$

wherein $R^1$ is hydrogen or a lower alkyl, $R^2$ is a higher alkyl having 8–20 carbon atoms, n is an integer of 2 or 3, m is an integer of 1 or 2 where m+n is 4. The lower alkyl preferably has 1–3 carbon atoms and the higher alkyl preferably has 14–18 carbon atoms. A bentonite sol treated with dimethyl tallow alkyl ammonium chloride or trimethyl tallow alkyl ammonium chloride is particularly preferably used.

The monomorrilonite organic complex is preferably used in an amount of 3–25% by weight based on the total of the phenol novolak epoxy resin, phenol novolak resin and curing-accelerating catalyst.

An organic solvent capable of dissolving the novolak epoxy resin and novolak resin is used. It is preferable to use a solvent having a boiling point of 100°–300° C. for reasons of smooth curing treatment. Illustrative of suitable organic solvents are cellosolves such as ethylene glycol monomethyl ether, ethylene glycol monoethyl ether, ethylene glycol monophenyl ether and acetic acid esters of these cellosolves; carbitols such as diethylene glycol monoethyl ether, diethylene glycol monobutyl ether and diethylene glycol monophenyl ether; aralkyl alcohol such as benzyl alcohol. These solvents may be used by themselves or as a mixture of two or more. The amount of the solvent is generally 20–80% by weight based on the total weight of the novolak epoxy resin and the novolak resin.

It is preferred that the above resist ink composition further contain an aliphatic polyol polyglycidyl ether in an amount of 10–100% by weight, more preferably 15–80% by weight based on the weight of the phenol novolak epoxy resin for reasons of prevention of occurrence of cracks in fine lines of the resist masking patterns. It is known that a flexibility-imparting agent can prevent the formation of cracks in a cured resin. However, it is also known that the additon of such a flexibility-imparting agent adversely affects the resistance of the cured resin against chemicals. It has been unexpectedly found that the addition of the polyol polyglycidyl ether can impart suitable flexibility to the resist masking pattern without adversely affecting its resistance to chemicals.

The aliphatic polyol polyglycidyl ether may be obtained by reacting an aliphatic polyol such as ethylene glycol, polyethylene glycol, 1,6-hexane diol or trimethylolpropane with epichlorohydrin in the presence of an alkali catalyst and preferably has an epoxy equivalent of 100–400. Illustrative of suitable polyglycidyl ethers are ethylene glycol diglycidyl ether, polyethylene glycol diglycidyl ethers, propylene glycol diglycidyl ether, polypropylene glycol diglycidyl ethers, neopentylglycol diglycidyl ether, 1,4-butane diol diglycidyl ether, 1,6-hexane diol diglycidyl ether, glycerol polyglycidyl ethers, polyglycerol polyglycidyl ethers, trimethylolpropane polyglycidyl ethers, sorbitol polyglycidyl ethers and halogenated derivatives thereof.

In the above case, it is preferable to use a polybutadiene in conjunction with the aliphatic polyol polyglycidyl ether, since foaming of the resulting ink composition may be effectively prevented. It has been found that the use of a conventional anti-foaming agent such as a silicone oil is much less effective as compared with the polybutadiene. Preferably, the polybutadiene has a molecular weight of 1,000–7,000 and contains 70–90% by weight of a cis-1,4-butadiene unit, 10–30% by weight of a trans-1,4-butadiene unit and 0–10% by weight of a 1,2-butadiene unit. The polybutadiene should be used in an amount not greater than 10%, preferably 0.05–5% based on the total weight of the phenol novolak epoxy resin, phenol novolak resin and aliphatic polyol polyglycidyl ether. Too large an amount of the polybutadiene in excess of 10% by weight is undesirable since the chemical resistance of the resulting ink tends to be lowered.

The resist ink composition may also contain a suitable amount of a coloring agent, such as a blue pigment, green pigment or carbon black, for obtaining masking pattern with good contrast. Other additives conventionally used in resist ink compositions may also be incorporated into the composition of the present invention, if desired.

The resist ink according to the present invention is in the form of a two-pack or two-part ink consisting of first and second parts. The first part contains the phenol novolak epoxy resin, the montmorllnite organic complex, and the organic solvent, while the second part contains the phenol novolak resin, the curing-accelerating catalyst and the organic solvent. The aliphatic polyol glycidyl ether and the polybutadiene may be incorporated into the first part. The polybutadiene and the montmollilonite organic complex may also be incorporated into the second part, if desired.

In use, the first and second parts are mixed with each other and a desired resist pattern is printed by screen printing on a board which has been previously punched and applied with a catalyst coating. The printed pattern is then cured at, for example, 100°–250° C. The resulting board is subjected to chemical plating to form a Cu wiring pattern. Such a method for the fabrication of printed circuit boards per se is well known in the art.

The following examples will further illustrate the present invention. In the examples, "part" is by weight.

EXAMPLE 1

The following two, first and second compositions were prepared:

| First composition: | |
|---|---|
| Epoxy resin*1 | 100 parts |
| Blue pigment*2 | 2 parts |
| Montmorrilonite complex*3 | 8 parts |
| Benzyl alcohol | 15 parts |
| Second composition: | |
| Phenol novolak resin*4 | 28 parts |
| Imidazole compound*5 | 1 part |
| Benzyl alcohol | 22 parts |

*1 Phenol novolak epoxy resin, epoxy equivalent: 176–181, EPIKOTE 154, manufactured by Yuka Shell Epoxy Inc.
*2 Cyanine blue
*3 Bentonite sol ion-exchanged with trimethyl tallow alkyl ammonium ion, ORBEN M, manufactured by Shiraishi Kogyo Co., Ltd.
*4 BRG-556, softening point: 80° C., manufactured by Showa Kobunshi Co., Ltd.
*5 2-Ethyl-4-methylimidazole The first composition (100 parts) was mixed with 75 parts of the second composition to obtain a resist ink and the ink was subjected to the following tests. The results are summarized in Table 1.

Stability test:

The thixotropy index ($T_0$) of the resist ink immediately after mixing the first and second composition and that ($T_1$) of the ink after being allowed to stand at 25° C. for 6 hours were measured. Evaluation was made as follows:

good: $|T_1-T_0|/T_0$ is less than 0.6
poor: $|T_1-T_0|/T_0$ is 0.6 or more.

Reproducibility test:

A resist pattern having a line width of 200 μm was printed by screen printing successively on each of 50 boards. After curing, the line width ($W_0$) of the pattern on the board of the initial printing and that ($W_1$) of the pattern of the 50th printing were measured. Evaluation was made as follows:

good: $|W_1-W_0|/W_0$ is less than 0.15
poor: $|W_1-W_0|/W_0$ is 0.15 or more.

Chemical resistance:

The resist pattern formed above was immersed in an aqueous solution containing 300 g/liter of chromium trioxide and 200 g/liter of sulfuric acid at 60° C. for 15 minutes. The surface of the resulting pattern was analyzed by a scanning electon microscope to detect formation of voids. Evaluation was made in the following rating:

good: no voids are formed
poor: voids are formed.

Cu deposition:

The resist ink was printed on a board by screen printing. After curing, the pattern was subjected to chemical plating to obtain a printed circuit board. The surface of the cured resin after the chemical plating was observed with a magnifying glass (magnification: ×20) and the number of copper particles was counted. The Cu deposition was expressed in terms of the number of copper particles per 1 $cm^2$.

EXAMPLE 2

Example 1 was repeated in the same manner as described except that 10 parts of bentonite ion-exchanged with dimethyl tallow alkyl ammonium *6 (*6: NEW D ORBEN, manufactured by Shiraishi Kogyo Co., Ltd.) were used as the montmorrilonite complex and the second composition was used in an amount of 74 parts per 100 parts of the first composition. The test results are summarized in Table 1.

COMPARATIVE EXAMPLE 1

Example 1 was repeated in the same manner as described except that 4 parts of fine silica powder *7 (*7: thixotropic agent, AERSIL #300 manufactured by Nihon Aerosil Co., Ltd.) were used in place of the 8 parts of the montmorrilonite complex and that the second composition was used in an amount of 78 parts per 100 parts of the first composition. The test results are summarized in Table 1.

COMPARATIVE EXAMPLE 2

Example 1 was repeated in the same manner as described except that the following composition was used as the first composition and that the second composition was used in an amount of 57 parts per 100 parts of the first composition:

| First composition: | |
|---|---|
| Epoxy resin*1 | 100 parts |
| Blue pigment*2 | 2 parts |
| Fine silica powder*7 | 2 parts |
| Benzyl alcohol | 20 parts |
| Clay*8 | 40 parts |

*1, *2, *7 as identified above
*8 FA-85 manufactured by Fuji Talc Kogyo Co., Ltd.

The test results are summarized in Table 1.

COMPARATIVE EXAMPLE 4

Example 1 was repeated in the same manner as described except that the following composition was used as the second composition and that the second composition was used in an amount of 34 parts per 100 parts of the first composition:

| Second composition: | |
|---|---|
| Aromatic amine*9 | 30 parts |
| Benzyl alcohol | 10 parts |

*9 Modified aromatic polyamine (WRAKKAMIDE WH-619, manufactured by Dainihon Ink Kagaku Kogyo Co., Ltd)

TABLE 1

| Example No. | Stability | Reproducibility | Chemical resistance | Cu deposition (/$cm^2$) |
|---|---|---|---|---|
| 1 | good | good | good | 5 |
| 2 | good | good | good | 8 |
| Comp. 1 | poor | poor | good | 700 |
| Comp. 2 | poor | poor | poor | 1000 |
| Comp. 3 | good | poor | good | 50 |

EXAMPLE 3

The following two, first and second compositions were prepared:

| First composition: | |
|---|---|
| Epoxy resin*1 | 75 parts |
| Glycidyl ether*10 | 25 parts |
| Black pigment*11 | 9 parts |
| Montmorrilonite complex*3 | 10 parts |
| Benzyl alcohol | 12 parts |
| Second composition: | |
| Phenol novolak resin*4 | 28 parts |
| Imidazole compound*5 | 1 part |

-continued

| Benzyl alcohol | 22 parts |

*1, *3, *4, *5 as identified above.
*10 IPOLITE 80MF, glycerin diglycidyl ether, epoxy equivalent: 140-170
*11 Carbon black MA-11, manufactured by Mitsubishi Kasei Corporation The first composition (100 parts) was mixed with 77 parts of the second composition to obtain a resist ink and the ink was subjected to a cracking test, chemical resistance test and Cu deposition test. The results are summarized in Table 2.

Cracking test

A pattern having a line width of 150 μm and a thickness of 20 μm was printed by screen printing on a board (100×500×1 mm). After curing at 150° C. for 30 minutes, the board was laterally warped until the center apex had a height of 200 mm from the plane involving the both ends of the board. Whether or not cracks were formed was visually checked.

EXAMPLE 4

Example 3 was repeated in the same manner as described except that EPOLITE 100 MF*12 (*12: Trimethylolpropane triglycidyl ether, epoxy equivalent: 135-165, manufactured by Kyosisha Yushi Kagaku Kogyo, Co., Ltd.) was used as the glycidyl ether in place of EPOLITE 80MF and that the second composition was used in an amount of 80 parts per 100 parts of the first composition. The results are summarized in Table 2.

EXAMPLE 5

The following two, first and second compositions were prepared:

| First composition: | |
| --- | --- |
| Epoxy resin*1 | 70 parts |
| Glycidyl ether*12 | 30 parts |
| Black pigment*13 | 9 parts |
| Montmorilonite complex*3 | 10 parts |
| Diethylene glycol monobutyl ether | 11 parts |
| Polybutadiene*14 | 1 part |
| Second composition: | |
| Phenol novolak resin*15 | 28 parts |
| Imidazole compound*5 | 1 part |
| Diethylene glycol monobutyl ether | 24 parts |

*1, *3, *5, *12 as identified above
*13 Carbon black, SPECIAL BLACK 4A manufactured by Degusa Inc.
*14 POLYOIL 110 manufactured by Nihon Zeon Inc.
*15 softening point: 98° C., manufactured by Arakawa Kagaku Kogyo Co., Ltd.

The first composition (100 parts) was mixed with 82 parts of the second composition to obtain a resist ink and the ink was subjected to a cracking test, chemical resistance test, Cu deposition test and foam test. The results are summarized in Table 2.

FOAM TEST

The ink was printed by screen printing at a squeegee speed of 400 mm/sec. Whether or not bubbles were formed was cracked.

TABLE 2

| Example No. | Formation of cracks | Formation of bubbles | Chemical resistance | Cu deposition (/cm²) |
| --- | --- | --- | --- | --- |
| 3 | none | — | good | 7 |
| 4 | none | — | good | 6 |
| 5 | none | none | good | 7 |

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A resist ink composition comprising:
   a phenol novolak epoxy resin having an epoxy equivalent of 170-250;
   a phenol novolak resin having a softening point of 60°-130° C.;
   an aliphatic polyol glycidyl ether in the amount of 10-100% based on the weight of said phenol novolak epoxy resin;
   a polybutadiene in the amount of 10% or less based on the weight of said phenol novolak epoxy resin;
   a montmorillonite organic complex;
   a curing-accelerating catalyst; and
   an organic solvent.

2. A resist ink composition according to claim 1, wherein said phenol novolak resin has a hydroxyl group equivalent of 100-150.

3. A resist ink composition according to claim 1, wherein the weight ratio of said phenol novolak resin to said phenol novolak epoxy resin is in the range of $0.5E_1/E_2$ to $2E_1/E_2$ where $E_1$ and $E_2$ represent the hydroxyl equivalent of said phenol novolak resin and the epoxy equivalent of said phenol novolak epoxy resin, respectively.

4. A resist ink composition according to claim 1, wherein said montmorillonite organic complex is bentonite ion-exchanged with alkyl ammonium.

5. A resist ink composition according to claim 1, wherein said montmorillonite organic complex is used in an amount of 3-25% by weight based on the total of the phenol novolak epoxy resin, phenol novolak resin and curing-accelerating catalyst.

6. A resist ink composition according to claim 1, wherein said aliphatic polyol glycidyl ether has an epoxy equivalent of 100-400.

7. A resist ink composition according to claim 1, wherein said polybutadiene has a molecular weight of 1,000-7,000 and contains 70-90% by weight of a cis-1,4-butadiene unit, 10-30% by weight of a trans-1,4-butadiene unit and 0-10% by weight of a 1,2-butadiene unit.

8. A resist ink composition according to claim 4, wherein said alkyl ammonium is one expressed by the following general formula:

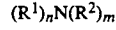

wherein $R^1$ is hydrogen or a lower alkyl, $R^2$ is an alkyl having 8-20 carbon atoms, n is an integer of 2 or 3, m is an integer of 1 or 2 where m+n is 4.

9. A two-part ink consisting of:
   a first part comprising:
      a phenol novolak epoxy resin having an epoxy equivalent of 170-250,
      an aliphatic polyol glycidyl ether in the amount of 10-100% based on the weight of said phenol novolak epoxy resin,
      a polybutadiene,
      a montmorillonite organic complex, and an organic solvent; and a second part comprising:
  a phenol novolak resin having a softening point of 60–130,
  a curing-accelerating catalyst, and an organic solvent,
said first and second parts, when mixed with each other, affording a composition serving as a resist ink.

10. A two-part ink according to claim 11, wherein said second part further contains a montmorillonite organic complex.

11. A resist ink composition according to claim 1, wherein said montmorillonite organic complex has an average particle size of 0.05–10 μm.

12. A resist ink composition according to claim 11, wherein said montomorillonite organic complex has an average particle size of 0.1–5 μm.

13. A resist ink composition according to claim 1 containing said polybutadiene in the amount of 0.05–5% based on the weight of said phenol novolak epoxy resin.

14. A two-part ink according to claim 9 wherein said polybutadiene is present in said first part in the amount of 10% or less based on the weight of said phenol novolak epoxy resin.

15. A two-part ink according to claim 9 wherein said first part contains said polybutadiene in the amount of 0.05–5% based on the weight of said phenol novolak epoxy resin.

* * * * *

UNITED STATES PATENT AND TRADEMARK OFFICE
CERTIFICATE OF CORRECTION

PATENT NO. : 5,061,744

DATED : October 29, 1991

INVENTOR(S) : OGITANI et al

It is certified that error appears in the above-identified patent and that said Letters Patent is hereby corrected as shown below:

ON THE TITLE PAGE

Under "Foreign Patent Documents", line 3, "5/1989" should read --11/1987--.

Column 1, line 25, "partterns" should read --patterns--;

line 27, "patters" should read --patterns--;

line 29, "attach" should read --attack--; and line 64, "montmollilonite" should read --montmorillonite--.

Column 2, line 4, "montmorllnite" should read --montmorillonite--.

UNITED STATES PATENT AND TRADEMARK OFFICE
CERTIFICATE OF CORRECTION

PATENT NO. : 5,061,744
DATED : October 29, 1991
INVENTOR(S) : OGITANI et al

It is certified that error appears in the above-identified patent and that said Letters Patent is hereby corrected as shown below:

Column 3, line 18, "montmorrilonite" should read --montmorillonite--;

line 19, "montmorrilonite" should read --montmorillonite--;

line 21, "montmorrilonite" should read --montmorillonite--;

line 37, "monomorrilonite" should read --montmorillonite--; and line 64, "additon" should read --addition--.

Column 4, line 46, "montmorllnite" should read --montmorillonite--; and line 52, "montmollilonite" should read --montmorillonite--.

Column 5, line 5, "Montmorrilonite" should read --Montmorillonite--;

UNITED STATES PATENT AND TRADEMARK OFFICE
CERTIFICATE OF CORRECTION

PATENT NO. : 5,061,744

DATED : October 29, 1991

INVENTOR(S) : OGITANI et al

It is certified that error appears in the above-identified patent and that said Letters Patent is hereby corrected as shown below:

line 38, "$W_o/W_o$" should read --$W_o|/W_o$--; and line 44, "electon" should read --electron--.

Column 6, line 7, "montmorrilonite" should read --montmorillonite--; and line 64, "Montmorrilonite" should read --montmorillonite--.

Column 7, line 26, "Kyosisha" should read --Kyoeisha--; and line 60, "cracked" should read --checked--.

UNITED STATES PATENT AND TRADEMARK OFFICE
CERTIFICATE OF CORRECTION

PATENT NO. : 5,061,744
DATED : October 29, 1991
INVENTOR(S) : OGITANI et al

It is certified that error appears in the above-indentified patent and that said Letters Patent is hereby corrected as shown below:

IN THE CLAIMS

Column 9, line 10, "claim 11" should read --claim 9--.

Signed and Sealed this

Eighth Day of June, 1993

Attest:

MICHAEL K. KIRK

Attesting Officer

Acting Commissioner of Patents and Trademarks